(12) United States Patent
McMullan et al.

(10) Patent No.: US 8,962,419 B2
(45) Date of Patent: Feb. 24, 2015

(54) COMPLEMENTARY STRESS MEMORIZATION TECHNIQUE LAYER METHOD

(71) Applicant: Texas Instruments Incorporated, Dallas, TX (US)

(72) Inventors: Russell Carlton McMullan, Allen, TX (US); Dong Joo Bae, Seoul (KR)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/497,697

(22) Filed: Sep. 26, 2014

(65) Prior Publication Data

US 2015/0011061 A1 Jan. 8, 2015

Related U.S. Application Data

(62) Division of application No. 12/506,753, filed on Jul. 21, 2009, now Pat. No. 8,871,587.

(60) Provisional application No. 61/082,358, filed on Jul. 21, 2008.

(51) Int. Cl.
*H01L 21/8238* (2006.01)
*H01L 29/78* (2006.01)
*H01L 21/265* (2006.01)
*H01L 21/02* (2006.01)
*H01L 21/324* (2006.01)

(52) U.S. Cl.
CPC *H01L 21/823864* (2013.01); *H01L 21/823814* (2013.01); *H01L 29/7843* (2013.01); *H01L 21/0217* (2013.01); *H01L 21/324* (2013.01)

USPC ..... 438/232; 438/199; 257/257; 257/E21.632

(58) Field of Classification Search
USPC .................................. 438/199, 232; 257/257
See application file for complete search history.

(56) References Cited

U.S. PATENT DOCUMENTS

| | | | |
|---|---|---|---|
| 7,632,729 B2 | 12/2009 | Chuang et al. | |
| 7,785,950 B2 | 8/2010 | Fang et al. | |
| 8,871,587 B2 * | 10/2014 | McMullan et al. | 438/232 |
| 2004/0115897 A1 | 6/2004 | Inoue et al. | |
| 2005/0233092 A1 | 10/2005 | Choi et al. | |
| 2007/0018252 A1 | 1/2007 | Zhu | |
| 2007/0249113 A1 | 10/2007 | Grudowski et al. | |
| 2008/0303101 A1 | 12/2008 | Kanarsky et al. | |
| 2009/0026548 A1 * | 1/2009 | Song et al. | 257/369 |
| 2009/0053865 A1 * | 2/2009 | Johnson et al. | 438/230 |
| 2009/0302401 A1 * | 12/2009 | Teo et al. | 257/410 |
| 2010/0012992 A1 * | 1/2010 | Pidin | 257/288 |

* cited by examiner

*Primary Examiner* — Alexander Ghyka
(74) *Attorney, Agent, or Firm* — Jacqueline J. Garner; Frederick J. Telecky, Jr.

(57) ABSTRACT

A process of forming a CMOS integrated circuit by forming a first stressor layer over two MOS transistors of opposite polarity, removing a portion of the first stressor layer from the first transistor, and forming a second stressor layer over the two transistors. A source/drain anneal is performed, crystallizing amorphous regions of silicon in the gates of the two transistors, and subsequently removing the stressor layers. A process of forming a CMOS integrated circuit by forming two transistors of opposite polarity, forming a two stressor layers over the transistors, annealing the integrated circuit, removing the stressor layers, and siliciding the transistors. A process of forming a CMOS integrated circuit with an NMOS transistor and a PMOS transistor using a stress memorization technique, by removing the stressor layers with wet etch processes.

10 Claims, 10 Drawing Sheets

COMPLEMENTARY STRESS MEMORIZATION TECHNIQUE LAYER METHOD

CROSS REFERENCE TO RELATED APPLICATIONS

This application is a divisional of U.S. Nonprovisional patent application Ser. No. 12/506,753, filed Jul. 21, 2009, and claims the priority of U.S. provisional application Ser. No. 61/082,358, filed Jul. 21, 2008, the contents of which are herein incorporated by reference in its entirety.

FIELD OF THE INVENTION

This invention relates to the field of integrated circuits. More particularly, this invention relates to metal oxide semiconductor (MOS) transistors in integrated circuits.

BACKGROUND OF THE INVENTION

Complementary metal oxide semiconductor (CMOS) integrated circuits include re-channel metal oxide semiconductor (NMOS) transistors and p-channel metal oxide semiconductor (PMOS) transistors. The NMOS transistors and PMOS transistors are commonly formed in and on a crystalline silicon substrate. It may be desired to apply a first stress condition, for example tensile stress, to channel regions of the NMOS transistors and a different stress condition, for example compressive stress, to channel regions of the PMOS transistors. It may be desired to apply the separate NMOS and PMOS stress conditions in a way that requires only one photolithographic operation compared to CMOS integrated circuit fabrication sequences in which independent NMOS and PMOS stress conditions are not applied.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A process of forming a CMOS integrated circuit may include forming a first stressor layer over NMOS and PMOS transistors prior to a source/drain anneal, followed by removing a portion or all of the first stressor layer from either the NMOS or PMOS transistors. A second stressor layer may be formed over the NMOS and PMOS transistors, providing desired levels of stress in the NMOS transistors and PMOS transistors. Each stressor layer may provide desired levels of hydrogen, fluorine or other species to the underlying transistors. Embodiments in which all of the first stressor layer is removed allow independent control of the interfaces between the NMOS and PMOS transistor and their respective stressor layers. Subsequently, the source/drain anneal is performed, so that crystal structures of silicon in the gates of the NMOS transistors and PMOS transistors are functions of the combined stress levels of the first and second stressor layers present over the transistors, the conditions of the interfaces between the NMOS and PMOS transistor and the stressor layers, and species released to the NMOS and PMOS transistor by the stressor layers during the anneal. The stressor layers may be subsequently removed, resulting in stress in the silicon gates of the NMOS transistors and PMOS transistors generating desired levels of stress in channel regions of the NMOS transistors and PMOS transistors.

DETAILED DESCRIPTION

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A CMOS integrated circuit may be formed by applying separate levels of stress to channel regions of NMOS and PMOS transistors. A first stressor layer may be formed over both the NMOS and PMOS transistors prior to a source/drain anneal, followed by removing a portion or all of the first stressor layer from either the NMOS or PMOS transistors. A second stressor layer may be formed over the NMOS and PMOS transistors. A combined stress level of the first stressor layer present over the NMOS transistors and the second stressor layer provides a desired level of stress in silicon gates of the NMOS transistors. Similarly, a combined stress level of the first stressor layer present over the PMOS transistors and the second stressor layer provides a desired level of stress in silicon gates of the PMOS transistors. An embodiment in which all the first stressor layer is removed allows direct contact between the second stressor layer and an underlying transistor. In such an embodiment, properties of the NMOS and PMOS transistors may be adjusted by conditions at interfaces between the stressor layers and their respective underlying transistors.

Subsequently, the source/drain anneal is performed, such that crystal structures of silicon in the gates of the NMOS transistors and PMOS transistors are functions of the stress levels of the combined first and second stressor layers present over the transistors. Furthermore, dopant distributions in source, drain and channel regions of the NMOS and PMOS transistors are functions of the interfaces between the transistors and the overlying stressor layers. For example, a higher ratio of silicon-hydrogen (Si—H) bonds to nitrogen-hydrogen (N—H) bonds in the stressor layer over a transistor may improve PMOS performance by affecting dopant diffusion outward from the channel region.

The stressor layers may also provide independently controlled amounts of hydrogen, fluorine or other species to the NMOS and PMOS transistors, released during the source/ drain anneal. For example, NMOS transistor may be provided with more hydrogen than PMOS transistors to improve low frequency noise in the NMOS transistors while avoiding degradation of negative bias temperature instability (NBTI) in the PMOS transistors.

The stressor layers may be subsequently removed, resulting in stress in the silicon gates of the NMOS transistors and PMOS transistors generating desired levels of stress in channel regions of the NMOS transistors and PMOS transistors.

Figure 1A:
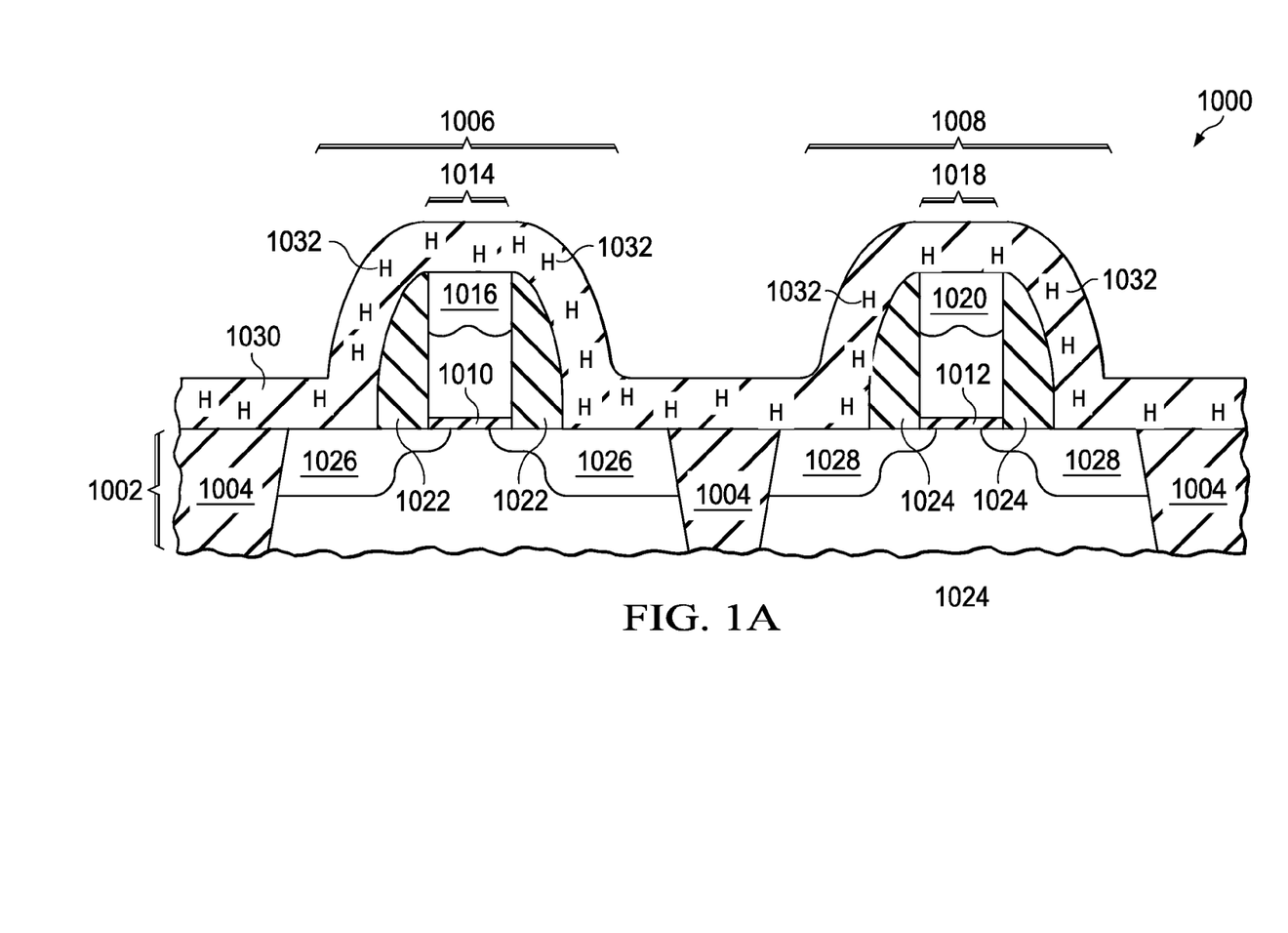
FIG. 1A through FIG. 1J are cross-sections of a CMOS integrated circuit formed according to an embodiment, depicted in various stages of fabrication.

FIG. 1A through FIG. 1J are cross-sections of a CMOS integrated circuit formed according to an embodiment, depicted in various stages of fabrication. Referring to FIG. 1A, the CMOS integrated circuit (1000) is formed in and on a semiconductor substrate (1002) which may be a single crystal silicon wafer, a silicon-on-insulator (SOI) wafer, a hybrid orientation technology (HOT) wafer with regions of different crystal orientations, or other material appropriate for fabrication of the CMOS integrated circuit (1000). Elements of field oxide (1004) may be formed at a top surface of the substrate (1002), commonly of silicon dioxide between 250 and 600 nanometers thick, commonly by shallow trench isolation (STI) or local oxidation of silicon (LOCOS) processes. In STI processes, silicon dioxide may be deposited by high density plasma (HDP) or high aspect ratio process (HARP). The field oxide elements (1004), if present, may isolate an area for a first polarity MOS transistor (1006) and an area for a second polarity MOS transistor (1008). The second polarity MOS transistor has an opposite polarity from the first transistor. In one realization of the instant embodiment, the first polarity MOS transistor (1006) may be an NMOS transistor and the second polarity MOS transistor (1008) may be a PMOS transistor. In an alternate realization, the first polarity MOS transistor (1006) may be a PMOS transistor and the second polarity MOS transistor (1008) may be an NMOS transistor.

A first gate dielectric layer (1010) is formed on the top surface of the substrate (1002) in the first polarity MOS transistor (1006). The first gate dielectric layer (1010) may be one or more layers of silicon dioxide ($SiO_2$), silicon oxy-nitride (SiON), aluminum oxide ($Al_2O_3$), aluminum oxy-nitride (AlON), hafnium oxide (HfO), hafnium silicate (HfSiO), hafnium silicon oxy-nitride (HfSiON), zirconium oxide (ZrO), zirconium silicate (ZrSiO), zirconium silicon oxy-nitride (ZrSiON), a combination of the aforementioned materials, or other insulating material. The first gate dielectric layer (1010) may include nitrogen as a result of exposure to a nitrogen containing plasma or a nitrogen containing ambient gas at temperatures between 50 C and 800 C. In one realization of the instant embodiment, the first gate dielectric layer (1010) may be between 1 and 4 nanometers thick. A thicker first gate dielectric layer (1010) may be formed for transistors operating above 2.5 volts. The first gate dielectric layer (1010) may be formed by any of a variety of gate dielectric formation processes, for example thermal oxidation, plasma nitridation of an oxide layer, and/or dielectric material deposition by atomic layer deposition (ALD).

A second gate dielectric layer (1012) is formed on the top surface of the substrate (1002) in the second polarity MOS transistor (1008). The second gate dielectric layer (1012) is formed of one or more materials and by one or more processes described in reference to the first gate dielectric layer (1010). In one realization of the instant embodiment, the second gate dielectric layer (1012) is formed concurrently with the first gate dielectric layer (1010).

A first MOS gate (1014) is formed on a top surface of the first gate dielectric layer (1010). The first MOS gate (1014) includes a top portion (1016) of silicon which is amorphized to some degree, for example by a previous first source/drain ion implantation operation. In one realization of the instant embodiment, the top portion (1016) of the first MOS gate (1014) may extend to the first gate dielectric layer (1010).

Similarly, a second MOS gate (1018) is formed on a top surface of the second gate dielectric layer (1012). The second MOS gate (1018) includes a top portion (1020) of silicon which is amorphized to some degree, for example by a previous second source/drain ion implantation operation. In one realization of the instant embodiment, the top portion (1020) of the second MOS gate (1018) may extend to the second gate dielectric layer (1012).

Optional first sidewall spacers (1022) and optional second sidewall spacers (1024) may be formed on lateral surfaces of the first MOS gate (1014) and the second MOS gate (1018), respectively. The first sidewall spacers (1022) and second sidewall spacers (1024) if present may be formed by deposition of one or more conformal layers of silicon nitride and/or silicon dioxide on top and lateral surfaces of the first MOS gate (1014) and the second MOS gate (1018) and the top surface of the substrate (1002), followed by removal of the conformal layer material from the top surface of the first MOS gate (1014) and the second MOS gate (1018) and the top surface of the substrate (1002) by anisotropic etching methods, leaving the conformal layer material on the lateral surfaces of the first MOS gate (1014) and the second MOS gate (1018). The first polarity MOS transistor (1006) includes first source/drain implanted regions (1026) in said substrate (1002) adjacent to said first MOS gate (1014). Similarly, the second polarity MOS transistor (1008) includes second source/drain implanted regions (1028) in said substrate (1002) adjacent to said second MOS gate (1018).

A first stressor layer (1030) is formed on an existing top surface of the CMOS integrated circuit (1000), covering the first polarity MOS transistor (1006) and the second polarity MOS transistor (1008). The first stressor layer (1030) may include one or more sub-layers of dielectric material such as silicon nitride. The first stressor layer (1030) may be formed by chemical vapor deposition (CVD), plasma enhanced chemical vapor deposition (PECVD), low pressure chemical vapor deposition (LPCVD), atmospheric pressure chemical vapor deposition (APCVD), high density plasma (HDP) or other suitable dielectric layer formation process. In one realization of the instant embodiment in which the first polarity MOS transistor (1006) is an NMOS transistor, the first stressor layer (1030) may be silicon nitride with tensile stress. In an alternate realization of the instant embodiment in which the first polarity MOS transistor (1006) is a PMOS transistor, the first stressor layer (1030) may be silicon nitride with compressive stress. In one realization of the instant embodiment, the first stressor layer (1030) may be between 55 and 65 nanometers thick. In one realization of the instant embodiment, the first stressor layer (1030) may have a stress level between $1 \times 10^{10}$ dynes/sq.cm and $3 \times 10^{10}$ dynes/sq.cm. An optional curing process, for example exposure to ultraviolet (UV) radiation, may be applied to the first stressor layer (1030) to provide a desired level of stress in the first stressor layer (1030). For example, providing a compressive stress level between $2 \times 10^{10}$ dynes/sq.cm and $2.5 \times 10^{10}$ dynes/sq.cm has been shown to reduce off-state leakage current in PMOS transistors by 1 percent compared to an embodiment providing less than $1 \times 10^{10}$ dynes/sq.cm. The first stressor layer (1030) may include hydrogen atoms (1032), fluorine atoms or other species which may be subsequently released during thermal processes. The first stressor layer (1030) may have a ratio of Si—H bonds to N—H bonds which may provide reduced off-state leakage current. For example, a ratio of Si—H bonds to N—H bonds above 7 has been shown to reduce PMOS off-state leakage current by 1 percent compared to an embodiment with a ratio of Si—H bonds to N—H bonds below 6.

Figure 1B:
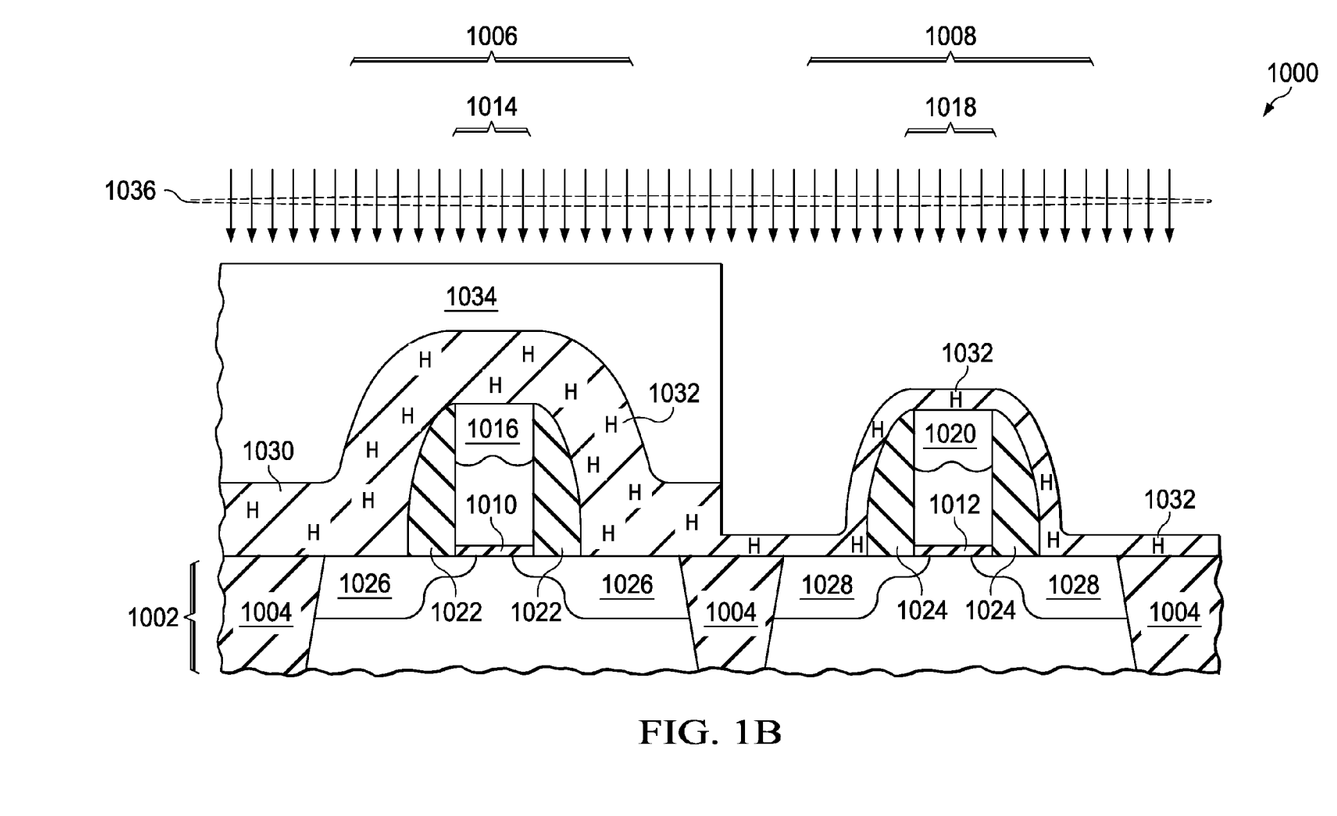
Figure 1C:
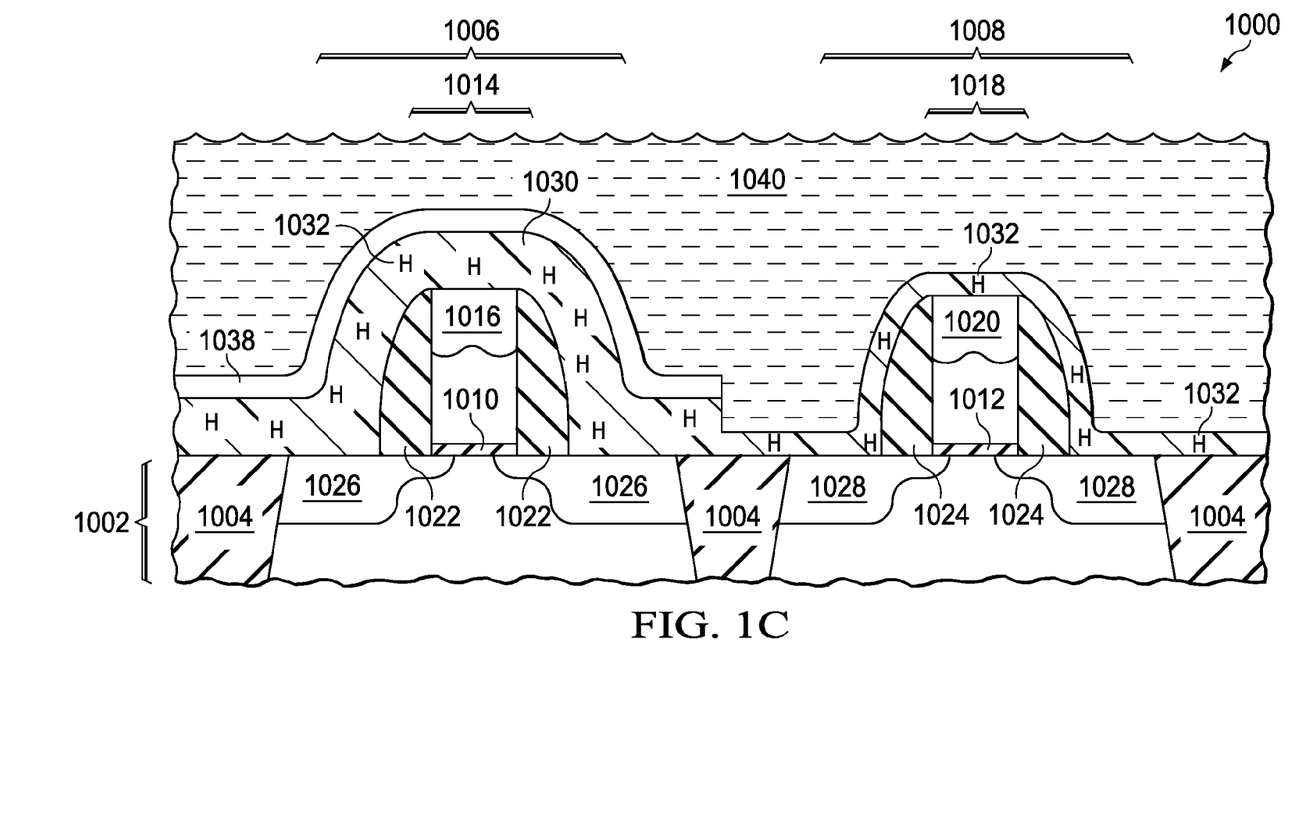

After the first stressor layer (1030) is formed on the CMOS integrated circuit (1000), a portion or all of the first stressor layer (1030) is removed from the second polarity MOS transistor (1008) area. FIG. 1B and FIG. 1C depict alternate processes for etching the first stressor layer (1030) over the second polarity MOS transistor (1008). Referring to FIG. 1B, a first stressor layer photoresist pattern (1034) is formed over an existing top surface of the CMOS integrated circuit (1000) to define an area for etching the first stressor layer (1030) by exposing a top surface of the first stressor layer (1030) in the area to be etched, which includes the second polarity MOS transistor (1008) area, and by covering the first stressor layer (1030) in an area not to be etched, which includes the first polarity MOS transistor (1006) area. A first stressor layer plasma etch process (1036), for example a reactive ion etch (RIE) process is performed in which reactive species are directed against a top surface of the first stressor layer photoresist pattern (1034) and against the exposed top surface of the first stressor layer (1030) in the area to be etched. Material is removed from the first stressor layer (1030) by the first stressor layer plasma etch process (1036) in the area to be etched until a desired thickness of the first stressor layer (1030) over the second polarity MOS transistor (1008) is attained. After the first stressor layer plasma etch process (1036) is completed, the first stressor layer photoresist pattern (1034) may be removed, for example by exposing the CMOS integrated circuit (1000) to an oxygen containing plasma, followed by a wet cleanup to remove any organic residue from a top surface of the first stressor layer (1030).

Referring to FIG. 1C, an area for etching the first stressor layer (1030) is defined by a photoresist pattern (not shown) as described in reference to FIG. 1B or by a hard mask (1038). The hard mask may (1038) be for example a layer of silicon dioxide formed on a top surface of the first stressor layer (1030), and patterned by forming a photoresist pattern over the CMOS integrated circuit (1000) as described in reference to FIG. 1B and selectively removing material so as to leave the hard mask (1038). A first stressor layer wet etch process (1040), depicted in FIG. 1C as a liquid layer (1040) on an existing top surface of the CMOS integrated circuit (1000), is used to remove material from the first stressor layer (1030) over the second polarity MOS transistor (1008). In realization of the instant embodiment in which the first stressor layer (1030) includes silicon nitride, the first stressor layer wet etch process (1040) may include an aqueous phosphoric acid solution. After the first stressor layer wet etch process (1040) is completed, the hard mask (1038) may be removed. In realizations of the instant embodiment in which the hard mask (1038) includes silicon dioxide and the first stressor layer (1030) includes silicon nitride, the hard mask (1038) may be removed for example by exposing the hard mask (1038) to a dilute and/or buffered aqueous solution of hydrofluoric acid.

Figure 1D:
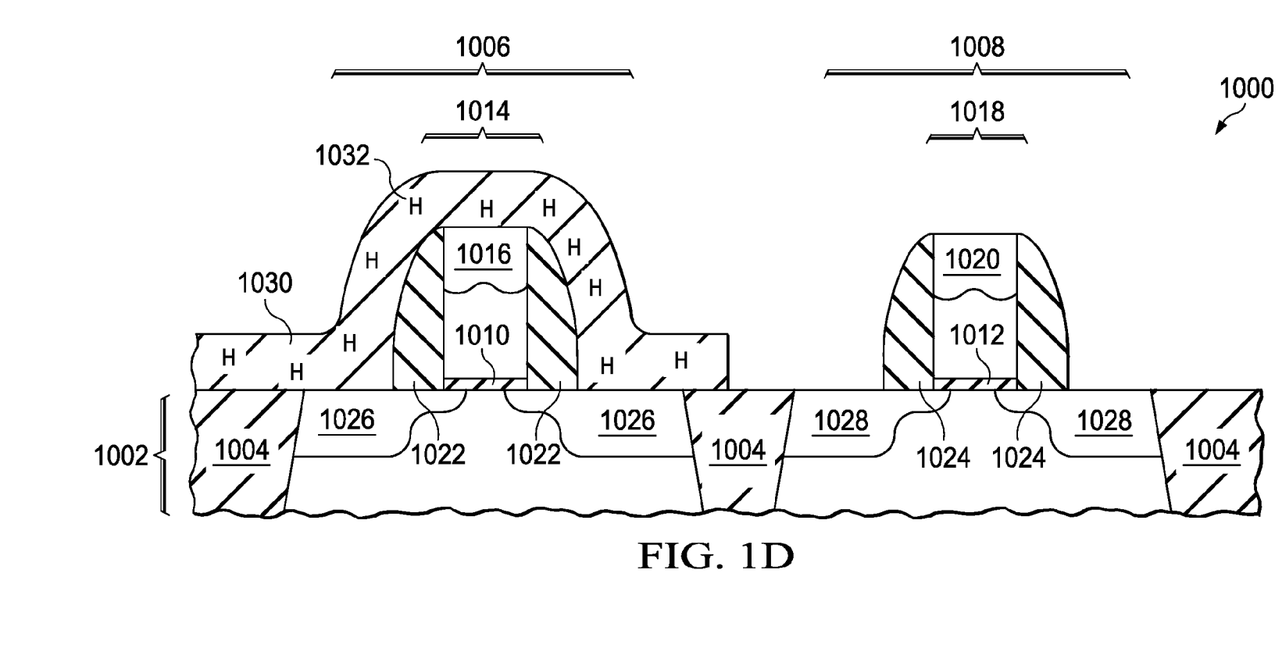

In some realizations of the instant embodiment, a portion of the first stressor layer (1030) may be left over the second polarity MOS transistor (1008) as depicted in FIG. 1B and FIG. 1C. In one realization of the instant embodiment, between one fourth and one half of the first stressor layer (1030) may remain over the second polarity MOS transistor (1008). In other realizations, substantially all the first stressor layer (1030) may be removed from over the second polarity MOS transistor (1008), as depicted in FIG. 1D.

Figure 1E:
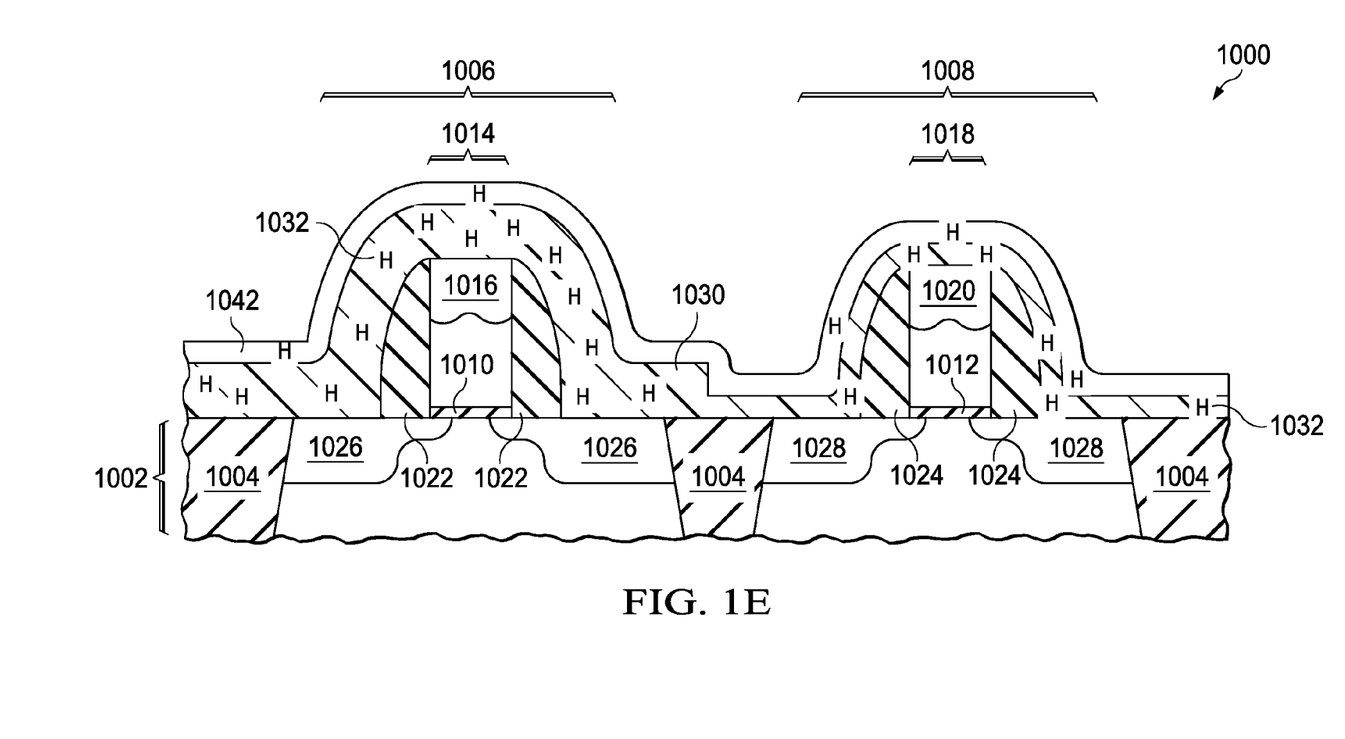

Referring to FIG. 1E, after removing material from the first stressor layer (1030) over the second polarity MOS transistor (1008), a second stressor layer (1042) is formed on an existing top surface of the CMOS integrated circuit (1000) over the first polarity MOS transistor (1006) and the second polarity MOS transistor (1008). The second stressor layer (1042) may be formed by CVD, PECVD, LPCVD, APCVD, HDP or other suitable dielectric layer formation process. The second stressor layer (1042) may include one or more sub-layers of dielectric material such as silicon nitride. In one realization of the instant embodiment in which the first polarity MOS transistor (1006) is an NMOS transistor, the second stressor layer (1042) may be silicon nitride with compressive stress. In an alternate realization of the instant embodiment in which the first polarity MOS transistor (1006) is a PMOS transistor, the second stressor layer (1042) may be silicon nitride with tensile stress. In one realization of the instant embodiment, the second stressor layer (1042) may be between 15 and 25 nanometers thick. In one realization of the instant embodiment, the second stressor layer (1042) may have a stress level between $1 \times 10^{10}$ dynes/sq.cm and $3 \times 10^{10}$ dynes/sq.cm. An optional curing process, for example exposure to ultraviolet (UV) radiation, may be applied to the second stressor layer (1042) to provide a desired level of stress in the second stressor layer (1042). The second stressor layer (1042) may have a different concentration of hydrogen (1032), fluorine or other species than the first stressor layer (1030). The second stressor layer (1042) may have a different ratio of Si—H bonds to N—H bonds from the first stressor layer (1030). In one realization in which the first polarity MOS transistor (1006) is a PMOS transistor, the first stressor layer (1030) may have a ratio of Si—H bonds to N—H bonds above 7 and the second stressor layer (1042) may have a ratio of Si—H bonds to N—H bonds below 5.

Figure 1F:
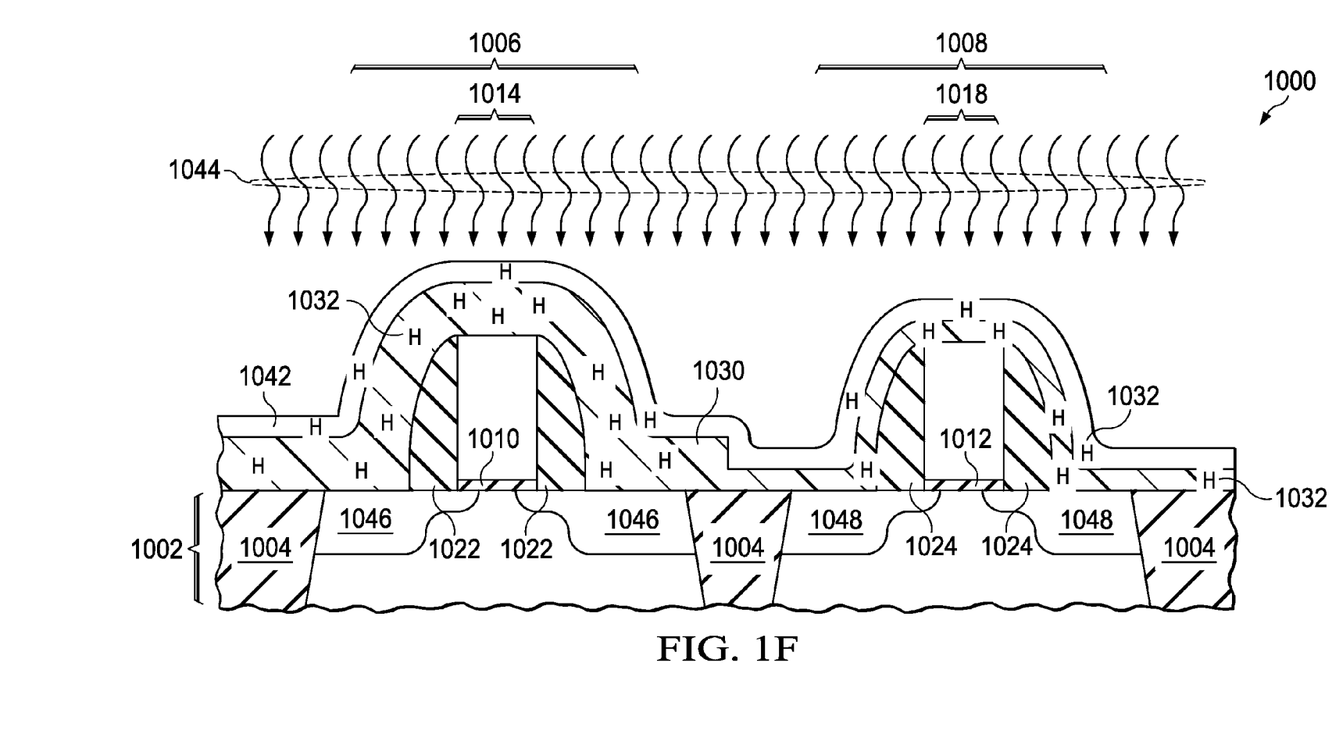

Referring to FIG. 1F, an anneal process (1044) is performed on the CMOS integrated circuit (1000), depicted schematically in FIG. 1E as thermal radiation (1044). During the anneal process (1044), the amorphous portions of the first MOS gate (1014) crystallize. A crystal structure and lateral dimensions of the first MOS gate (1014) after the anneal process (1044) is completed are functions of the combined stress levels of the first stressor layer (1030) and the second stressor layer (1042) over the first polarity MOS transistor (1006). The anneal process (1044) repairs some lattice damage in the first source/drain implanted regions (elements (1026) in FIG. 1A through FIG. 1D) to form first source/drain diffused regions (1046) in the first polarity MOS transistor (1006). Hydrogen atoms (1032), fluorine atoms (not shown) or other species may be transferred to the first polarity MOS transistor (1006) or the second polarity MOS transistor (1008).

Similarly, during anneal process (1044), the amorphous portions of the second MOS gate (1018) crystallize. A crystal structure and lateral dimensions of the second MOS gate (1018) after the anneal process (1044) is completed are functions of the combined stress levels of the first stressor layer (1030) if present and the second stressor layer (1042) over the second polarity MOS transistor (1008), as well as the interfaces between the stressor layers (1030, 1042) and the transistors (1006, 1008). The anneal process (1044) repairs some lattice damage in the second source/drain implanted regions (elements (1028) in FIG. 1A through FIG. 1D) to form first source/drain diffused regions (1048) in the second polarity MOS transistor (1008). In one realization of the instant embodiment, the anneal process (1044) may be performed using a rapid thermal processor, which may heat the CMOS integrated circuit to a temperature between 1050 C and 1200 C for a time between 1 and 30 seconds. In an alternate realization, the anneal process (1044) may be performed using a scanning laser anneal tool, which may heat the CMOS integrated circuit to a temperature between 1250 C and 1350 C for a time between 10 microseconds and 1 millisecond. Other realizations of the anneal process (1044) are within the scope of the instant embodiment.

Figure 1G:
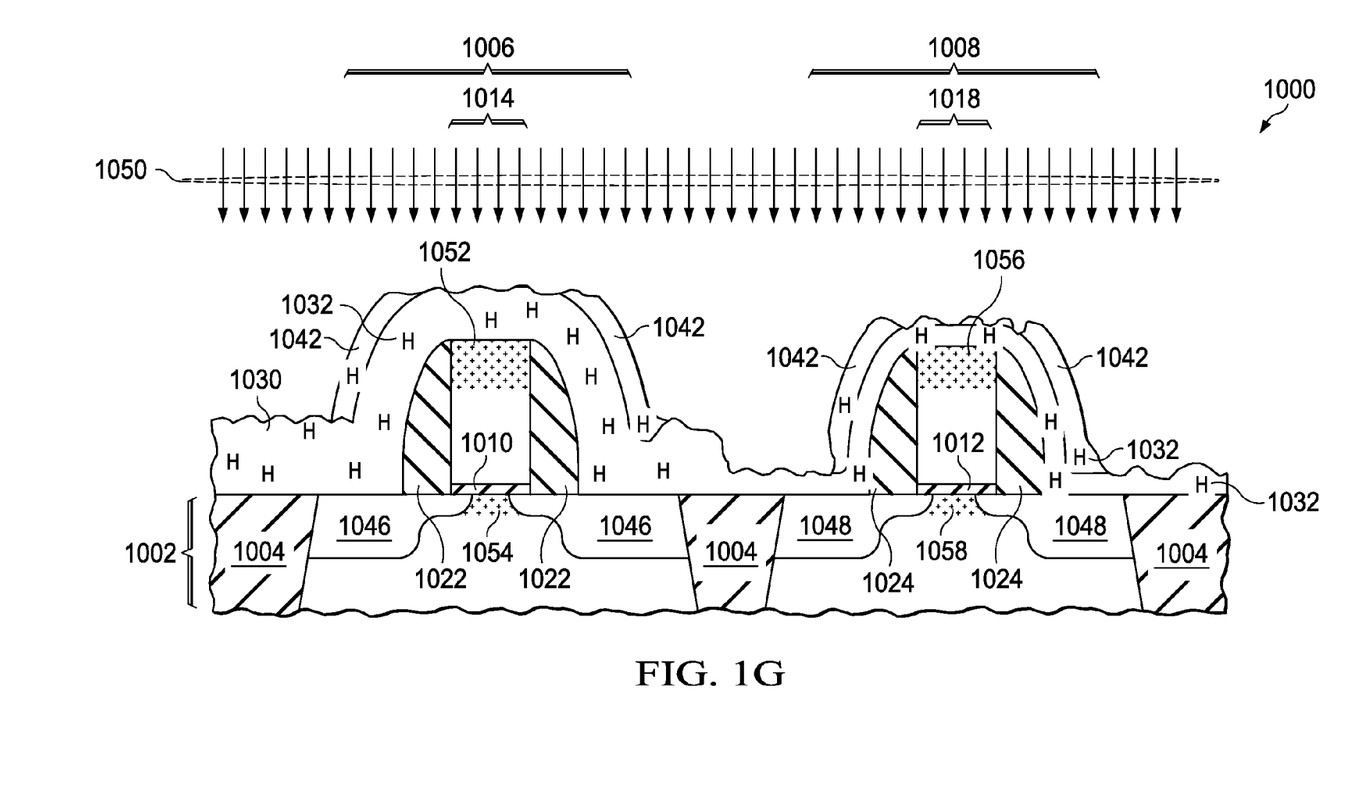
Figure 1H:
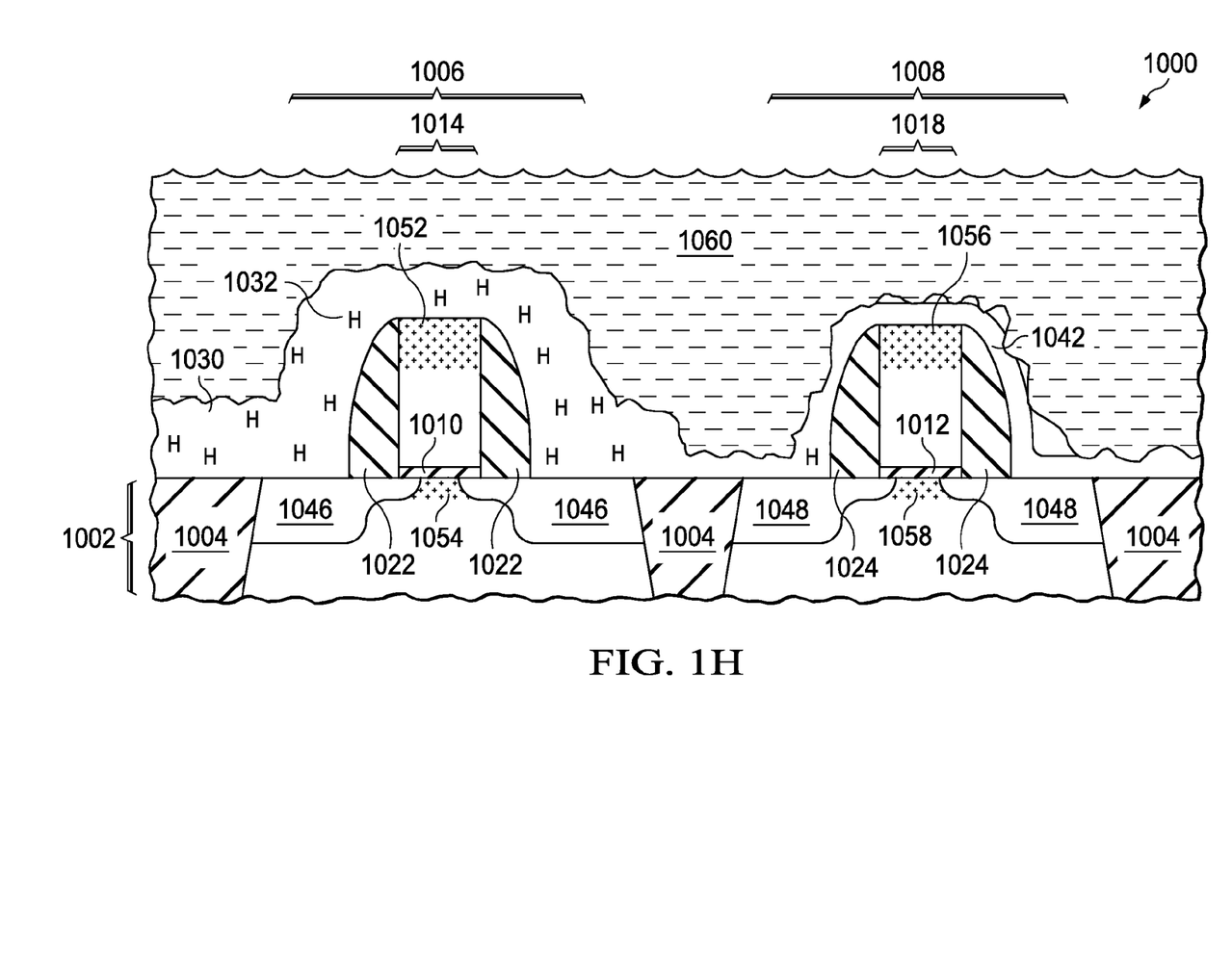

After the anneal process (1044) is completed, the first stressor layer (1030) and the second stressor layer (1042) are removed from over the first polarity MOS transistor (1006) and the second polarity MOS transistor (1008). FIG. 1G and FIG. 1H depict two possible processes for removing the stressor layers (1030) and (1042). Other processes for removing the stressor layers (1030) and (1042) are within the scope of the instant embodiment. Referring to FIG. 1G, a stressor layer plasma etch process (1050) removes material from the first stressor layer (1030) and the second stressor layer (1042). As material is removed from the stressor layers (1030) and (1042) over the first polarity MOS transistor (1006), the first MOS gate (1014) accumulates first gate stress (1052) depicted in FIG. 1G as first gate stress points (1052). First gate stress (1052) in the first MOS gate (1014) generates first channel stress (1054) in the substrate (1002) under the first gate dielectric layer (1010) depicted in FIG. 1G as channel stress points (1054). In a realization of the instant embodiment in which a net stress of the first stressor layer (1030) and the second stressor layer (1042) over the first polarity MOS transistor (1006) is compressive, the first channel stress (1054) may also be compressive. Conversely, in a realization of the instant embodiment in which a net stress of the first stressor layer (1030) and the second stressor layer (1042) over the first polarity MOS transistor (1006) is tensile, the first channel stress (1054) may also be tensile. Similarly, as material is removed from the first stressor layer (1030) if present and the second stressor layer (1042) over the second polarity MOS transistor (1008), the second MOS gate (1018) accumulates second gate stress (1056) depicted in FIG. 1G as gate stress points (1056). Second gate stress (1056) in the second MOS gate (1018) generates second channel stress (1058) in the substrate (1002) under the second gate dielectric layer (1012) depicted in FIG. 1G as channel stress points (1058). In a realization of the instant embodiment in which a net stress of the first stressor layer (1030) if present and the second stressor layer (1042) over the second polarity MOS transistor (1008) is compressive, the second channel stress (1058) may also be compressive, and vice versa. In one realization of the instant embodiment, the stressor layer plasma etch process (1050) removes substantially all the first stressor layer (1030) and the second stressor layer (1042), and removes substantially none of the first MOS gate (1014) and the second MOS gate (1018).

FIG. 1H depicts the CMOS integrated circuit (1000) during an alternate procedure for removing the first stressor layer (1030) and the second stressor layer (1042). A stressor layer wet etch process (1060), depicted in FIG. 1H as a liquid layer (1060), removes material from the first stressor layer (1030) and the second stressor layer (1042). As material is removed from the stressor layers (1030) and (1042) over the transistors (1006) and (1008), first gate stress (1052) and second gate stress (1056) accumulate in the MOS gates (1014) and (1018), respectively, and first channel stress (1054) and second channel stress (1058) accumulate in the substrate (1002) under the gate dielectric layers (1010) and (1012), respectively, as described in reference to FIG. 1G. The first channel stress (1054) may have a same polarity (compressive or tensile) as a net stress of the first stressor layer (1030) and the second stressor layer (1042) over the first polarity MOS transistor (1006), as described in reference to FIG. 1G. Similarly, the second channel stress (1058) may have a same polarity (compressive or tensile) as a net stress of the first stressor layer (1030) if present and the second stressor layer (1042) over the second polarity MOS transistor (1008). In one realization of the instant embodiment, the stressor layer wet etch process (1060) removes substantially all the first stressor layer (1030) and the second stressor layer (1042), and removes substantially none of the first MOS gate (1014) and the second MOS gate (1018).

Figure 1I:
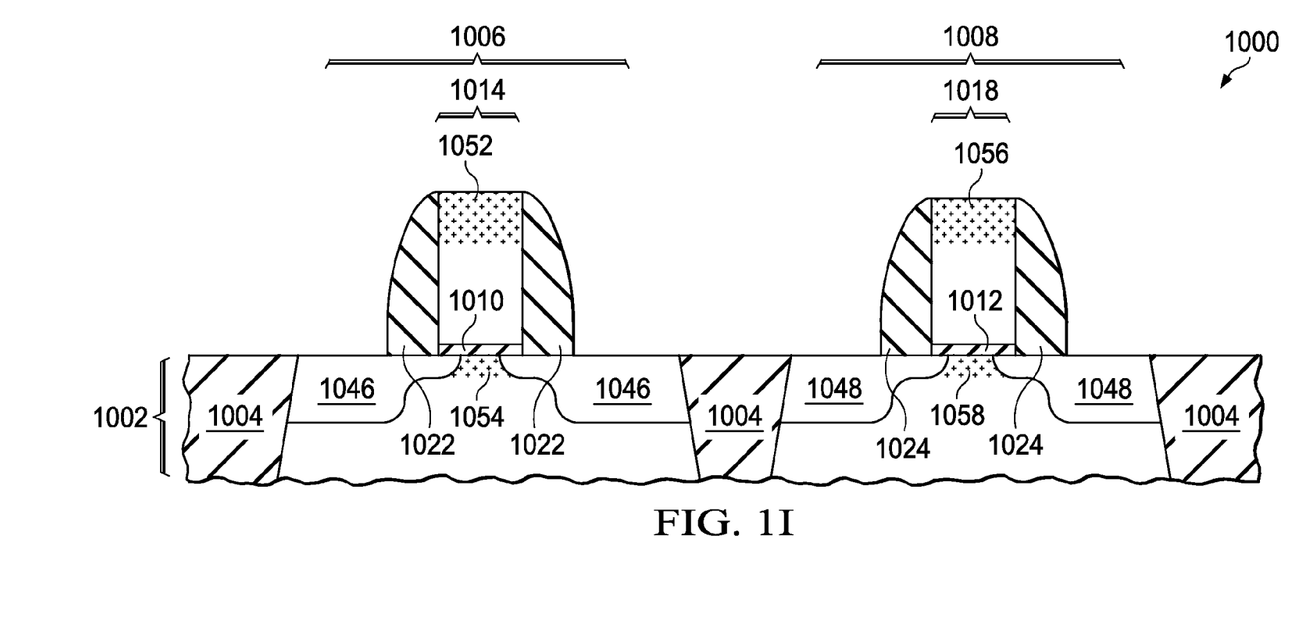

FIG. 1I depicts the CMOS integrated circuit (1000) after removal of the stressor layers, elements (1030) and (1042) in FIG. 1A through FIG. 1H. First channel stress (1054) may have a desired level and polarity (compressive or tensile) so that performance parameters, for example on-state current density, of the first polarity MOS transistor (1006) may be improved compared to similar transistors with no channel stress. Similarly, second channel stress (1058) may have a desired level and polarity (compressive or tensile) so that performance parameters of the second polarity MOS transistor (1008) may be improved compared to similar transistors with no channel stress.

Figure 1J:
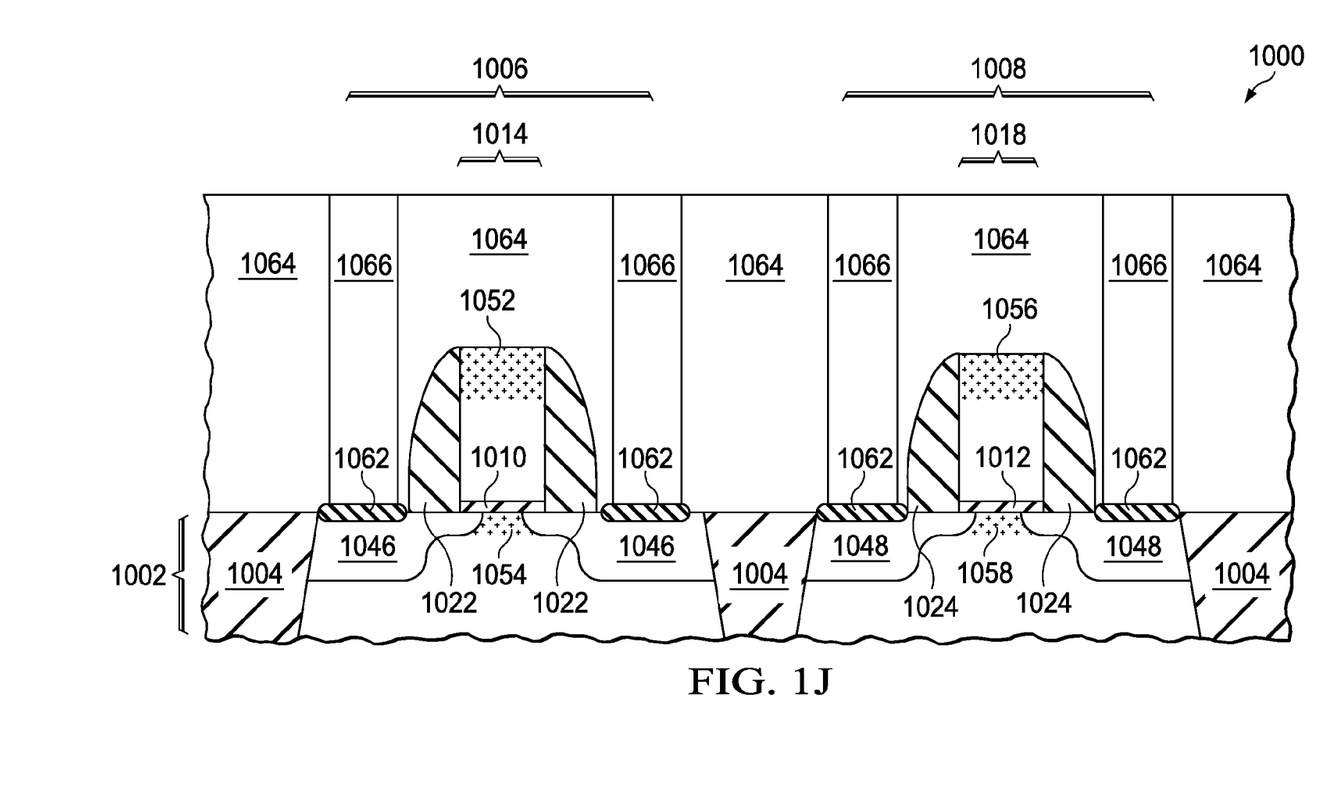

FIG. 1J depicts the CMOS integrated circuit (1000) at a subsequent stage of fabrication. Metal silicide layers (1062) are formed on the first source/drain diffused regions (1046) and the second source/drain diffused regions (1048). The metal silicide layers (1062) may be formed by depositing a layer of metal, such as nickel, cobalt or titanium, on an existing top surface of the CMOS integrated circuit (1000), heating the CMOS integrated circuit (1000) to react a portion of the metal with exposed silicon in the first source/drain diffused regions (1046) and the second source/drain diffused regions (1048), and selectively removing unreacted metal from the CMOS integrated circuit (1000) surface, commonly by exposing the CMOS integrated circuit (1000) to wet etchants including a mixture of an acid and hydrogen peroxide.

A pre-metal dielectric (PMD) layer (1064) is formed on an existing top surface of the CMOS integrated circuit (1000). The PMD layer (1064) is commonly a dielectric layer stack including a PMD liner, a PMD main layer, and an optional PMD cap layer. The PMD liner is commonly silicon nitride or silicon dioxide, 10 to 100 nanometers thick, deposited by plasma enhanced chemical vapor deposition (PECVD) on the existing top surface of the CMOS integrated circuit (1000). The PMD main layer is commonly a layer of silicon dioxide, phospho-silicate glass (PSG) or boro-phospho-silicate glass (BPSG), commonly 100 to 1000 nanometers thick, deposited by PECVD on a top surface of the PMD liner, and sometimes leveled by a chemical-mechanical polish (CMP) process. The optional PMD cap layer is commonly 10 to 100 nanometers of a hard material such as silicon nitride, silicon carbide nitride or silicon carbide, formed on a top surface of the PMD main layer.

Contacts (1066) are formed in the PMD layer (1064) to make electrical contact to the metal silicide layers (1062). The contacts (1066) may be formed by defining contact areas on a top surface of the PMD layer (1541062 with a contact photoresist pattern, not shown in FIG. 1J for simplicity, etching contact holes in the contact areas by removing PMD layer material using known etching methods to expose the metal silicide layers (1062), and filling the contact holes with an optional contact liner metal, such as titanium, and a contact fill metal, commonly tungsten, followed by removal of the contact fill metal from the top surface of the PMD layer (1064) using etching and/or CMP methods.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming a complementary metal oxide semiconductor (CMOS) integrated circuit, comprising steps:
providing a semiconductor substrate;
providing a PMOS transistor formed in and on said substrate, including:
a first gate dielectric layer formed on a top surface of said substrate;
a PMOS gate formed on a top surface of said first gate dielectric layer, said PMOS gate including silicon, in which a top portion of silicon which is amorphized to some degree;
first gate sidewall spacers formed on vertical surfaces of said PMOS gate; and
first source/drain implanted region formed in said substrate adjacent to said PMOS gate;
providing a NMOS transistor formed in and on said substrate in an area separate from said PMOS transistor, including:
a second gate dielectric layer formed on a top surface of said substrate;
a NMOS gate formed on a top surface of said second gate dielectric layer, said NMOS gate including silicon, in which a top portion of silicon which is amorphized to some degree;
second gate sidewall spacers formed on vertical surfaces of said NMOS gate; and
second source/drain implanted region formed in said substrate adjacent to said NMOS gate;
forming a first stressor layer of silicon nitride over said PMOS transistor and said NMOS transistor, said first stressor layer having a compressive stress level between 1×1010 dynes/sq.cm and 3×1010 dynes/sq.cm, a ratio of Si—H bonds to N—H bonds greater than 7, and having a thickness between 55 and 65 nanometers;
removing a portion of said first stressor layer from over said NMOS transistor using an aqueous phosphoric acid solution so that between one fourth and one half of said first stressor layer remains over said NMOS transistor;
forming a second stressor layer over said PMOS transistor and said NMOS transistor, said second stressor layer having a tensile stress level between 1×1010 dynes/sq.cm and 3×1010 dynes/sq.cm, a ratio of Si—H bonds to N—H bonds less than 5, and a thickness between 15 and 25 nanometers;
with said first stressor layer over the PMOS gate and said second stressor layer over both the PMOS gate and the NMOS gate, performing an anneal operation on said CMOS integrated circuit using a scanning laser anneal tool, such that:
said CMOS integrated circuit is heated to a temperature between 1250° C. and 1350° C. for a time between 10 microseconds and 1 millisecond so that:
lattice damage in said first source/drain implanted regions is repaired;
lattice damage in said second source/drain implanted regions is repaired;
said top portion of said PMOS gate is crystallized; and
said top portion of said NMOS gate is crystallized;
removing said first stressor layer and said second stressor layer from over said PMOS transistor and said NMOS transistor using an aqueous phosphoric acid solution.

2. A process of forming a complementary metal oxide semiconductor (CMOS) integrated circuit, comprising steps:
forming a p-type metal oxide semiconductor (PMOS) transistor in and on a semiconductor substrate;
forming a n-type metal oxide semiconductor (NMOS) transistor in and on said substrate; and
performing a dual stress layer memorization process using a single masking layer by:
forming a first stressor layer over said PMOS transistor and said NMOS transistor;
removing a portion of said first stressor layer from over the NMOS transistor using said single masking layer;
forming a second stressor layer over the PMOS transistor and the NMOS transistor, said second stressor layer overlying and in direct contact with the first stressor layer over the PMOS transistor;
performing an anneal operation on said CMOS integrated circuit while the first stressor layer is over the PMOS transistor and the second stressor layer is over both the PMOS transistor and the NMOS transistor; and
removing said first stressor layer and said second stressor layer from over said PMOS transistor and said NMOS transistor.

3. The process of claim 2, wherein:
the first stressor layer is silicon nitride, such that the first stressor layer has compressive stress; and
the second stressor layer is silicon nitride, such that the second stressor layer has tensile stress.

4. The process of claim 3, wherein:
the first stressor layer has a thickness between 55 and 65 nanometers and has a stress level between 1×1010 dynes/sq.cm and 3×1010 dynes/sq.cm; and
the second stressor layer has a thickness between 15 and 25 nanometers and has a stress level between 1×1010 dynes/sq.cm and 3×1010 dynes/sq.cm.

5. The process of claim 3, wherein the first stressor layer has a ratio of Si—H bonds to N—H bonds greater than 7.

6. The process of claim 5, wherein the second stressor layer has a ratio of Si—H bonds to N—H bonds less than 5.

7. A process of forming a complementary metal oxide semiconductor (CMOS) integrated circuit, comprising steps:
forming a PMOS transistor in and on a semiconductor substrate;
forming a NMOS transistor in and on said substrate; and
performing a dual stress layer memorization process using a single masking layer by:
forming a first stressor layer over said PMOS transistor and said NMOS transistor;
thinning a portion of said first stressor layer over the NMOS transistor using said single masking layer such that the first stressor layer includes a thinned portion over the NMOS transistor and an unthinned portion over the PMOS transistor;
forming a second stressor layer on and in direct contact with both the thinned portion and the unthinned portion of the first stressor layer;
performing an anneal operation on said CMOS integrated circuit while the first stressor layer is over the PMOS transistor and the second stressor layer is over both the PMOS transistor and the NMOS transistor; and removing said first stressor layer and said second stressor layer from over said PMOS transistor and said NMOS transistor.

8. The process of claim 7, wherein:

the first stressor layer is silicon nitride, such that the first stressor layer has compressive stress; and the second stressor layer is silicon nitride, such that the second stressor layer has tensile stress.

9. The process of claim 8, wherein:

the first stressor layer has a thickness between 55 and 65 nanometers and has a stress level between $1\times10^{10}$ dynes/sq.cm and $3\times10^{10}$ dynes/sq.cm; and the second stressor layer has a thickness between 15 and 25 nanometers and has a stress level between $1\times10^{10}$ dynes/sq.cm and $3\times10^{10}$ dynes/sq.cm.

10. The process of claim 9, wherein the first stressor layer has a ratio of Si—H bonds to N—H bonds greater than 7 and the second stressor layer has a ratio of Si—H bonds to N—H bonds less than 5.

* * * * *